(12) United States Patent
Wang et al.

(10) Patent No.: US 11,637,152 B2
(45) Date of Patent: Apr. 25, 2023

(54) ARRAY SUBSTRATE AND METHOD FOR MANUFACTURING THE SAME, AND DISPLAY DEVICE HAVING PHOTOSENSITIVE ELEMENT, LIGHT EMITTING DEVICE AND SENSING TRANSISTOR

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 326 days.

(21) Appl. No.: 16/759,508

(22) PCT Filed: Jun. 11, 2019

(86) PCT No.: PCT/CN2019/090741
§ 371 (c)(1),
(2) Date: Apr. 27, 2020

(87) PCT Pub. No.: WO2020/248128
PCT Pub. Date: Dec. 17, 2020

(65) Prior Publication Data
US 2022/0005888 A1    Jan. 6, 2022

(51) Int. Cl.
*H01L 27/32* (2006.01)
*H01L 51/56* (2006.01)

(52) U.S. Cl.
CPC ...... *H01L 27/3227* (2013.01); *H01L 27/3244* (2013.01); *H01L 51/56* (2013.01); *H01L 2227/323* (2013.01)

(58) Field of Classification Search
CPC .. H01L 27/3227; H01L 27/3244; H01L 51/56
See application file for complete search history.

(56) References Cited

U.S. PATENT DOCUMENTS

2007/0126664 A1*  6/2007  Kimura ............... H01L 27/1255
                                                                    345/76
2010/0007632 A1*  1/2010  Yamazaki ........... H01L 27/3234
                                                                    345/175
(Continued)

FOREIGN PATENT DOCUMENTS

CN    105304673 A    2/2016
CN    107230691 A    10/2017
(Continued)

*Primary Examiner* — Michael Jung
(74) *Attorney, Agent, or Firm* — The Webb Law Firm

(57) ABSTRACT

The present disclosure provides an array substrate and a method for manufacturing the same, and a display device. The array substrate includes: a base substrate; a photosensitive element located between the base substrate and a light emitting device and configured to sense light emitted from the light emitting device and generate a sensing signal according to the light; a capacitor configured to store the sensing signal; and a sensing transistor located between the base substrate and the photosensitive element and configured to transmit the sensing signal to a sensing line, wherein an orthographic projection of the sensing transistor on the base substrate at least partially overlaps with an orthographic projection of the photosensitive element on the base substrate.

16 Claims, 8 Drawing Sheets

(56) References Cited

U.S. PATENT DOCUMENTS

| | | |
|---|---|---|
| 2015/0364527 A1 | 12/2015 | Wang et al. |
| 2017/0278909 A1 | 9/2017 | Jeon et al. |
| 2018/0053032 A1 | 2/2018 | Ding et al. |
| 2019/0386033 A1 | 12/2019 | Li et al. |
| 2020/0161402 A1 | 5/2020 | Wang et al. |

FOREIGN PATENT DOCUMENTS

| | | |
|---|---|---|
| CN | 107425038 A | 12/2017 |
| CN | 108767016 A | 11/2018 |
| CN | 108831912 A | 11/2018 |
| CN | 109285870 A | 1/2019 |
| JP | 2011118158 A | 6/2011 |

\* cited by examiner (d)

(e)

(f)

ARRAY SUBSTRATE AND METHOD FOR MANUFACTURING THE SAME, AND DISPLAY DEVICE HAVING PHOTOSENSITIVE ELEMENT, LIGHT EMITTING DEVICE AND SENSING TRANSISTOR

CROSS-REFERENCE TO RELATED APPLICATION

This Application is the United States national phase of International Application No. PCT/CN2019/090741 filed Jun. 11, 2019, the disclosure of which is hereby incorporated by reference in its entirety.

TECHNICAL FIELD

The present disclosure relates to an array substrate and a method for manufacturing the same, and a display device.

BACKGROUND

In the related art, a display panel will be optically compensated after being manufactured. In order to implement optically compensation of the display panel, a photosensitive element and a sensing transistor may be disposed in an array substrate of the display panel.

SUMMARY

According to one aspect of the embodiments of the present disclosure, an array substrate is provided. The array substrate comprises: a base substrate; a photosensitive element located between the base substrate and a light emitting device and configured to sense light emitted from the light emitting device and generate a sensing signal according to the light; a capacitor configured to store the sensing signal; and a sensing transistor located between the base substrate and the photosensitive element and configured to transmit the sensing signal to a sensing line, wherein an orthographic projection of the sensing transistor on the base substrate at least partially overlaps with an orthographic projection of the photosensitive element on the base substrate.

In some embodiments, the array substrate further comprises a first dielectric layer covering the sensing transistor, wherein: the capacitor comprises: a first metal layer connected to the signal line and located on one side of the first dielectric layer away from the base substrate, a second dielectric layer located on the one side of the first dielectric layer away from the base substrate and one side of the first metal layer away from the base substrate, wherein an orthographic projection of the first metal layer on the base substrate is within an orthographic projection of the second dielectric layer on the base substrate, and a second metal layer located on one side of the second dielectric layer away from the base substrate and connected to a first electrode of the sensing transistor through a first via penetrating the second dielectric layer and the first dielectric layer; and the photosensitive element is located on one side of the second metal layer away from the base substrate.

In some embodiments, the second metal layer is partially located in the first via and in contact with the first electrode of the sensing transistor.

In some embodiments, the photosensitive element comprises a P-type semiconductor layer, and an N-type semiconductor layer located between the P-type semiconductor layer and the second metal layer.

In some embodiments, the array substrate further comprises: a planarization layer located on the one side of the second dielectric layer away from the base substrate and one side of the P-type semiconductor layer away from the base substrate, wherein the planarization layer defines a first opening extending to the P-type semiconductor layer; and an electrode layer partially located in the first opening and in contact with the P-type semiconductor layer, wherein the electrode layer is connected to the metal layer through a second via penetrating the planarization layer and the second dielectric layer.

In some embodiments, the electrode layer is partially located in the second via and in contact with the first metal layer.

In some embodiments, the sensing transistor comprises: an active layer; a gate dielectric layer located on one side of the active layer away from the base substrate; a gate located on one side of the gate dielectric layer away from the active layer; an interlayer dielectric layer located on one side of the gate dielectric layer away from the base substrate and covering the gate, wherein the interlayer dielectric layer defines a second opening and a third opening which extend to the active layer; and a second electrode at least partially located in the third opening and in contact with the active layer, and wherein the first electrode is at least partially located in the second opening and in contact with the active layer.

In some embodiments, the photosensitive element further comprises an intrinsic semiconductor layer located between the P-type semiconductor layer and the N-type semiconductor layer.

In some embodiments, a material of at least one of the P-type semiconductor layer, the N-type semiconductor layer, or the intrinsic semiconductor layer comprises hydrogen.

In some embodiments, the array substrate further comprises: a driving transistor located between the base substrate and the light emitting device, wherein an orthographic projection of the driving transistor on the base substrate is spaced apart from the orthographic projection of the sensing transistor on the base substrate.

In some embodiments, the orthographic projection of the sensing transistor on the base substrate is within the orthographic projection of the photosensitive element on the base substrate.

According to another aspect of the embodiments of the present disclosure, a display device is provided. The display device comprises the array substrate according to any one of the above embodiments.

According to a further aspect of the embodiments of the present disclosure, a method for manufacturing an array substrate is provided. The method comprises: providing a base substrate; forming a sensing transistor and a capacitor on one side of the base substrate; and forming a photosensitive element on one side of the sensing transistor away from the base substrate, wherein an orthographic projection of the photosensitive element on the base substrate at least partially overlaps with an orthographic projection of the sensing transistor on the base substrate, wherein: the photosensitive element is configured to sense light emitted from a light emitting device and generate a sensing signal according to the light, the capacitor is configured to store the sensing signal, and the sensing transistor is configured to transmit the sensing signal to a sensing line.

In some embodiments, the method further comprises forming a first dielectric layer covering the sensing transistor after forming the sensing transistor, wherein: the forming of the capacitor comprises: forming a first metal layer connected to a signal line on one side of the first dielectric layer away from the base substrate, forming a second dielectric layer on the one side of the first dielectric layer away from the base substrate and one side of the first metal layer away from the base substrate, wherein an orthographic projection of the first metal layer on the base substrate is within an orthographic projection of the second dielectric layer on the base substrate, and forming a second metal layer on one side of the second dielectric layer away from the base substrate, wherein the second metal layer is connected to a first electrode of the sensing transistor through a first via penetrating the second dielectric layer and the first dielectric layer; and the forming of the photosensitive element comprises forming the photosensitive element on one side of the second metal layer away from the base substrate.

In some embodiments, forming the photosensitive element comprises forming an N-type semiconductor layer on one side of the second metal layer away from the base substrate; and forming a P-type semiconductor layer on one side of the N-type semiconductor layer away from the base substrate.

In some embodiments, the method further comprises: forming a planarization layer on the one side of the second dielectric layer away from the base substrate and one side of the P-type semiconductor layer away from the base substrate, wherein the planarization layer defines a first opening extending to the P-type semiconductor layer; and forming an electrode layer partially located in the first opening and in contact with the P-type semiconductor layer, wherein the electrode layer is connected to the first metal layer through a second via penetrating the planarization layer and the second dielectric layer.

In some embodiments, forming the sensing transistor comprises: forming an active layer; forming a gate dielectric layer on one side of the active layer away from the base substrate; forming a gate on one side of the gate dielectric layer away from the active layer; forming an interlayer dielectric layer covering the gate on one side of the gate dielectric layer away from the base substrate, wherein the interlayer dielectric layer defines a second opening and a third opening which extend to the active layer; forming the first electrode at least partially located in the second opening and in contact with the active layer; and forming a second electrode at least partially located in the third opening and in contact with the active layer.

In some embodiments, the gate and the signal line are formed by a same patterning process.

In some embodiments, forming the photosensitive element further comprises forming an intrinsic semiconductor layer on one side of the N-type semiconductor layer away from the base substrate, wherein the P-type semiconductor layer is formed on one side of the intrinsic semiconductor layer away from the base substrate.

In some embodiments, the method further comprises forming a driving transistor on the one side of the base substrate, wherein the driving transistor is located between the base substrate and the light emitting device, and an orthographic projection of the driving transistor on the base substrate is spaced apart from the orthographic projection of the sensing transistor on the base substrate.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
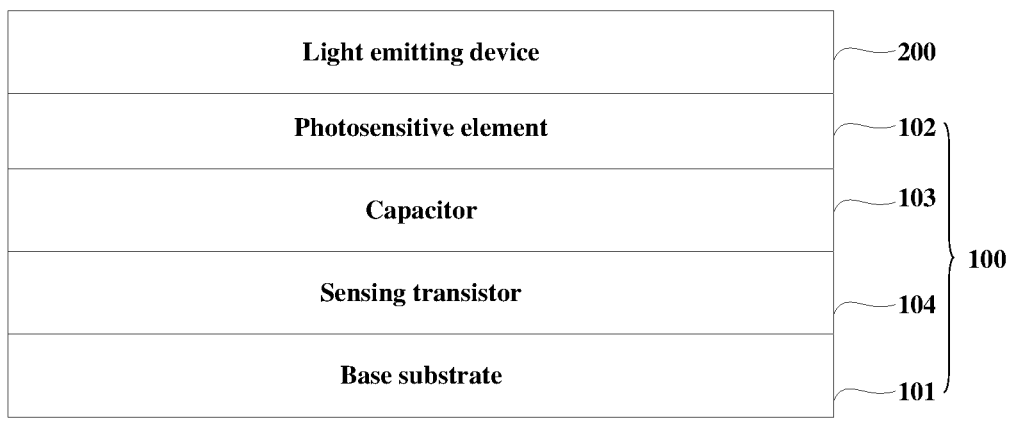
FIG. 1A is a schematic structure view showing an array substrate according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, the photosensitive element and the sensing transistor in the array substrate each occupies a part of the layout area of the array substrate without overlapping with each other. Therefore, the photosensitive element and the sensing transistor occupy a large area of a pixel where the photosensitive element and the sensing transistor are located, which results in a lower aperture ratio of the pixel.

In view of the above, the embodiments of the present disclosure propose the following technical solutions.

FIG. 1A is a schematic structure view showing an array substrate according to an embodiment of the present disclosure.

As shown in FIG. 1A, the array substrate 100 may comprise a base substrate 101, a photosensitive element 102, a capacitor 103 and a sensing transistor 104. It should be understood that the array substrate 100 may further comprise other members, such as a driving transistor or the like.

The base substrate 101 may comprise, for example, a flexible base substrate. In some implementations, the material of the base substrate 101 may comprise, but is not limited to, polyimide (PI), for example.

The photosensitive element 102 is located between the base substrate 101 and a light emitting device 200. The photosensitive element 102 is configured to sense a light emitted from the light emitting device 200 and generate a sensing signal according to the light emitted from the light emitting device 200. The sensing signal may be an electric signal generated based on the sensed light. For example, the photosensitive element 102 may comprise a photodiode. The light emitting device 200 may comprise, for example, an organic light emitting diode (OLED).

The capacitor 103 is configured to store the sensing signal generated by the photosensitive element 102. It should be noted that although the capacitor 103 shown in FIG. 1A is located between the photosensitive element 102 and the sensing transistor 104, this is not restrictive.

The sensing transistor 104 is located between the base substrate 101 and the photosensitive element 102. The sensing transistor 104 is configured to transmit the sensing signal stored by the capacitor 103 to a sensing line.

Here, the orthographic projection of the sensing transistor 104 on the base substrate 101 at least partially overlaps with the orthographic projection of the photosensitive element 102 on the base substrate 101. In some implementations, the orthographic projection of the sensing transistor 104 on the base substrate 101 may partially overlap with the orthographic projection of the photosensitive element 102 on the base substrate 101. In other implementations, the orthographic projection of the sensing transistor 104 on the base substrate 101 may be within the orthographic projection of the photosensitive element 102 on the base substrate 101.

In the above embodiments, the sensing transistor 104 and the photosensitive element 102 are stacked, and the orthographic projection of the sensing transistor 104 on the base substrate 101 at least partially overlaps with the orthographic projection of the photosensitive element 102 on the base substrate 101. Such an array substrate may increase the aperture ratio of the pixels. In addition, since the sensing transistor 104 is located between the base substrate 101 and the photosensitive element 102, the adverse effect of the light emitted from the light emitting device 200 on the sensing transistor 104 is reduced.

Figure 1B:
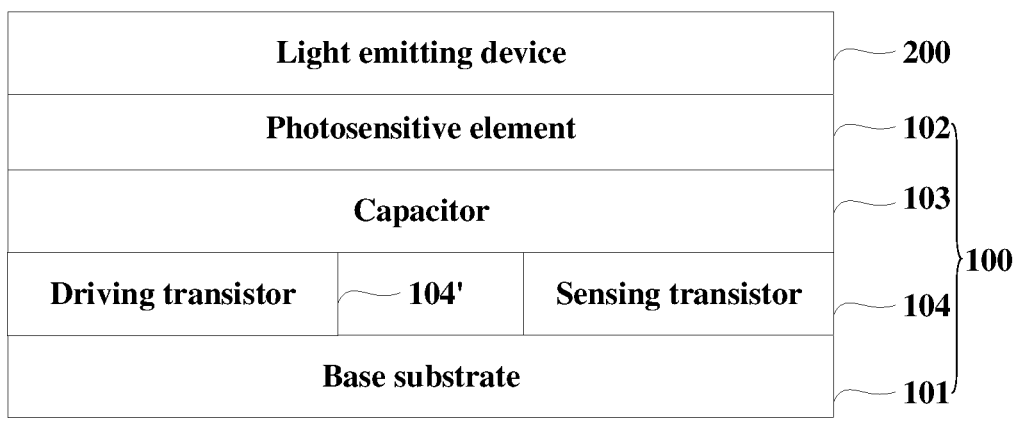
FIG. 1B is a schematic structure view showing an array substrate according to another embodiment of the present disclosure.

FIG. 1B is a schematic structure view showing an array substrate according to another embodiment of the present disclosure.

In some embodiments, referring to FIG. 1B, the array substrate 100 may comprise a driving transistor 104' between the base substrate 101 and the light emitting device 200. The driving transistor 104' is configured to drive the light emitting device 200 to emit light. The orthographic projection of the driving transistor 104' on the base substrate 101 is spaced apart from the orthographic projection of the sensing transistor 104 on the base substrate 101. For example, the driving transistor 104' and the sensing transistor 104 may be located on the surface of the base substrate 101 spaced apart from each other.

Figure 2:
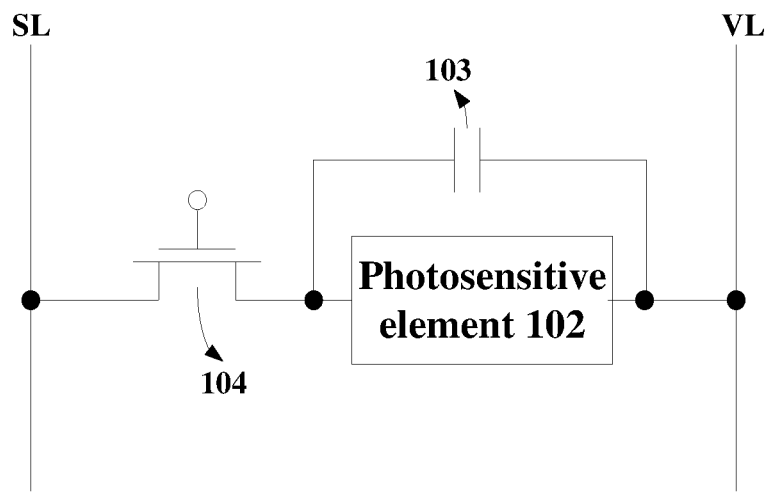
FIG. 2 is a schematic view showing a sensing transistor, a capacitor, and a photosensitive element connected to each other according to an embodiment of the present disclosure.

FIG. 2 is a schematic view showing a sensing transistor, a capacitor, and a photosensitive element connected to each other according to an embodiment of the present disclosure.

As shown in FIG. 2, the photosensitive element 102 is connected to the capacitor 103 and a signal line VL. The sensing transistor 104 is connected to the sensing line SL and the capacitor 103. It should be understood that in the display panel, each sub-pixel comprises a photosensitive element 102, a capacitor 103, a sensing transistor 104 as shown in FIG. 2, and a light emitting device 200 as shown in FIG. 1.

Taking the photosensitive element 102 which is a photodiode as an example, a negative potential may be applied to the signal line VL to make the photosensitive element 102 be in a reverse biased state. In the case where the light emitting device 200 emits light, the sensing transistor 104 is turned off, the photosensitive element 102 generates a sensing signal (a photocurrent signal) based on the sensed light emitted from the light emitting device 200, and the capacitor 103 stores the sensing signal generated by the photosensitive element 102. In the case where the light emitting device 200 does not emit light, the sensing transistor 104 is turned on, and the sensing transistor 104 transmits the sensing signal stored by the capacitor 103 to the sensing line SL. The peripheral circuit may calculate a compensation voltage according to the sensing signal from the sensing line SL and may further optically compensate a sub-pixel.

In the above manner, the sensing signal of each sub-pixel may be obtained, thus some or all of the sub-pixels in the display panel may be optically compensated based on the sensing signals.

Figure 3:
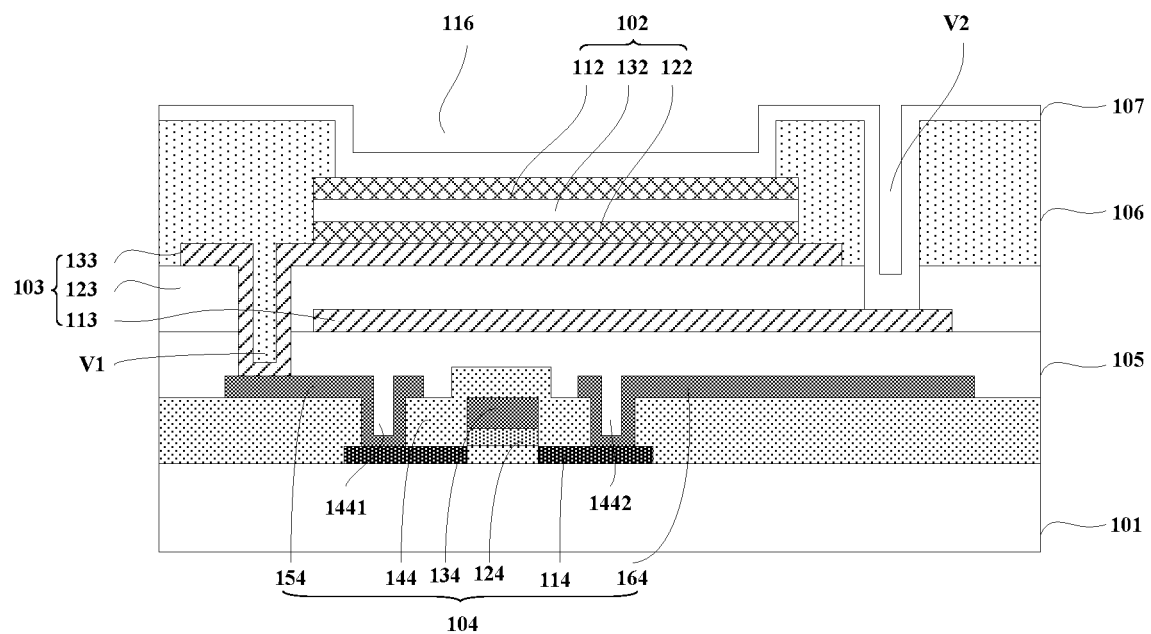
FIG. 3 is a schematic structure view showing an array substrate according to another embodiment of the present disclosure.

FIG. 3 is a schematic structure view showing an array substrate according to another embodiment of the present disclosure.

As shown in FIG. 3, the sensing transistor 104 may comprise an active layer 114, a gate dielectric layer 124, a gate 134, an interlayer dielectric layer 144, a first electrode 154 and a second electrode 164. One of the first electrode 154 and the second electrode 164 is a source, and the other is a drain.

In some embodiments, the sensing transistor 104 may be a top-gate transistor. For example, referring to FIG. 3, the gate dielectric layer 124 is located on one side of the active layer 114 away from the base substrate 101. The gate 134 is located on one side of the gate dielectric layer 124 away from the active layer 114. The interlayer dielectric layer 144 is located on one side of the gate dielectric layer 124 away from the base substrate 101 and covers the gate 134. The interlayer dielectric layer 144 defines a second opening 1441 and a third opening 1442 which extend to the active layer 114. The first electrode 154 is at least partially located in the second opening 1441 and in contact with the active layer 114. The second electrode 164 is at least partially located in the third opening 1442 and in contact with the active layer 114. It should be understood that, in some embodiments, a part of the first electrode 154 and a part of the second electrode 164 may be located on the surface of the interlayer dielectric layer 144. For example, the material of each of the first electrode 154 and the second electrode 164 may comprise a metallic material.

In other embodiments, the sensing transistor may be a bottom-gate transistor. In this case, the gate 134 may be located between the base substrate 101 and the active layer 114, and the gate dielectric layer 124 is located between the gate 134 and the active layer 114.

The structure of the capacitor 103 will be described below in conjunction with FIG. 3.

In some embodiments, as shown in FIG. 3, the array substrate 100 may comprise a first dielectric layer 105 covering the sensing transistor 104. The capacitor 103 may comprise a first metal layer 113, a second dielectric layer 123, and a second metal layer 133. The photosensitive element 102 is located on one side of the second metal layer 133 away from the base substrate 101.

The first metal layer 113 is connected to the signal line VL and located on one side of the first dielectric layer 105 away from the base substrate 101. The second dielectric layer 123 is located on one side of the first dielectric layer 105 away from the base substrate 101 and on one side of the first metal layer 113 away from the base substrate 101. Here, the orthographic projection of the first metal layer 113 on the base substrate 101 is within the orthographic projection of the second dielectric layer 123 on the base substrate 101. In other words, the second dielectric layer 123 completely covers the first metal layer 113.

The second metal layer 133 is located on one side of the second dielectric layer 123 away from the base substrate 101. The second metal layer 133 is connected to the first electrode 154 of the sensing transistor 104 through the first via V1 penetrating the second dielectric layer 123 and the first dielectric layer 105. For example, the second metal layer 133 may be partially located in the first via V1 and in contact with the first electrode 154 of the sensing transistor 104. In some embodiments, a connecting member may be additionally formed in the first via V1, and the second metal layer 133 is connected to the first electrode 154 of the sensing transistor 104 through the connecting member in the first via V1.

For example, the materials of the first metal layer 113 and the second metal layer 133 may comprise metal materials such as Ag, Cu, Al, or Mo. For another example, the materials of the first metal layer 113 and the second metal layer 133 may comprise an alloy comprising one of the foregoing metal materials, such as AlNd or MoNb. In some embodiments, the first metal layer 113 and the second metal layer 133 may comprise a stack comprising a metal layer and an alloy layer comprising one of the foregoing metal materials, for example, MoNb/Cu/MoNb or the like. In some embodiments, the first metal layer 113 and the second metal layer 133 may comprise a stack comprising a metal layer, an alloy layer, and a transparent conductive oxide layer, for example, Mo/AlNd/ITO, ITO/Ag/ITO or the like.

As some implementations, the material of each of the first dielectric layer 105 and the second dielectric layer 123 may comprise silicon oxide or the like.

In the above embodiments, the capacitor 103 is located between the photosensitive element 102 and the sensing transistor 104, and the first metal layer 113 and the second metal layer 133 in the capacitor 103 can prevent certain elements (e.g., hydrogen) in the photosensitive element 102 from diffusing to the sensing transistor 104 to mitigate the adverse effect of these elements on the sensing transistor 104.

In some embodiments, referring to FIG. 3, the photosensitive element 102 may comprise a P-type semiconductor layer 112 and an N-type semiconductor layer 122 located between the P-type semiconductor layer 112 and the second metal layer 133. That is, the photosensitive element 102 is a photodiode. In other embodiments, referring to FIG. 3, the photosensitive element 102 may comprise a P-type semiconductor layer 112, an N-type semiconductor layer 122, and an intrinsic semiconductor layer 132 between the P-type semiconductor layer 112 and the N-type semiconductor layer 122. That is, the photosensitive element 102 is a PIN-type photodiode.

In some embodiments, the material of at least one of the P-type semiconductor layer 112, the N-type semiconductor layer 122, or the intrinsic semiconductor layer 132 may comprise hydrogen. For example, the materials of the P-type semiconductor layer 112, the N-type semiconductor layer 122, and the intrinsic semiconductor layer 132 may comprise amorphous silicon with hydrogen. The first metal layer 113 and the second metal layer 133 in the capacitor 103 can prevent the hydrogen in the photosensitive element 102 from diffusing to the sensing transistor 104 to reduce the adverse effect of the hydrogen on the active layer 114 of the sensing transistor 104.

In some embodiments, referring to FIG. 3, the array substrate 100 may further comprise a planarization layer 106 and an electrode layer 107.

The planarization layer 106 is located on one side of the second dielectric layer 123 away from the base substrate 101 and one side of the P-type semiconductor layer 112 away from the base substrate 101. Moreover, the planarization layer 106 defines a first opening 116 extending to the P-type semiconductor layer 112. In some implementations, the material of the planarization layer 106 may comprise an organic material such as polysiloxane, polymethyl methacrylate (PMMA), polyimide, or the like.

The electrode layer 107 is partially located in the first opening 116 and in contact with the P-type semiconductor layer 112. The electrode layer 107 is connected to the first metal layer 113 through a second via V2 penetrating the planarization layer 106 and the second dielectric layer 123. In some implementations, the electrode layer 107 may be partially located in the second via V2 and in contact with the first metal layer 113. In other implementations, the electrode layer 107 may be connected to the first metal layer 113 through a connecting member located in the second via V2. As some examples, the material of the electrode layer 107 may comprise, but is not limited to, indium tin oxide (ITO).

Figure 4:
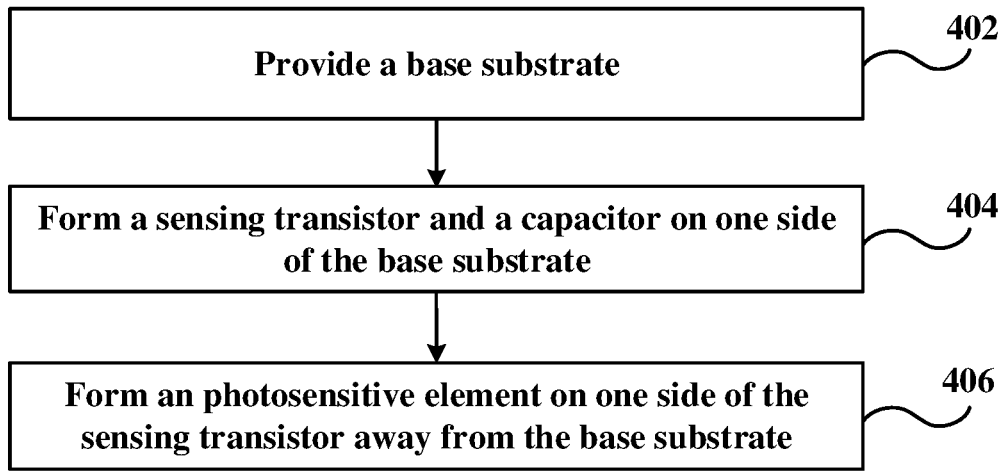
FIG. 4 is a schematic flowchart showing a method for manufacturing an array substrate according to an embodiment of the present disclosure.

FIG. 4 is a schematic flowchart showing a method for manufacturing an array substrate according to an embodiment of the present disclosure.

As shown in FIG. 4, the method for manufacturing an array substrate comprises steps 402-406.

At step 402, a base substrate is provided.

At step 404, a sensing transistor and a capacitor are formed on one side of the base substrate.

At step 406, a photosensitive element is formed on one side of the sensing transistor away from the base substrate. The orthographic projection of the photosensitive element on the base substrate at least partially overlaps with the orthographic projection of the sensing transistor on the base substrate.

Here, the photosensitive element is configured to sense light emitted from the light emitting device and generate a sensing signal according to the light emitted from the light emitting device, the capacitor is configured to store the sensing signal generated by the photosensitive element, and the sensing transistor is configured to transmit the sensing signal stored by the capacitor to the sensing line.

FIGS. 5A-5K are schematic cross-sectional views showing structures obtained in different stages of forming an array substrate according to some embodiments of the present disclosure. FIGS. 6A-6B are schematic views showing a layout design of an array substrate according to some embodiments of the present disclosure.

The method for manufacturing an array substrate according to some embodiments of the present disclosure will be described below in conjunction with FIGS. 5A-5K and FIGS. 6A-6B.

First, the process of forming the sensing transistor 104 will be introduced in conjunction with FIGS. 5A-5D.

Figure 5A:
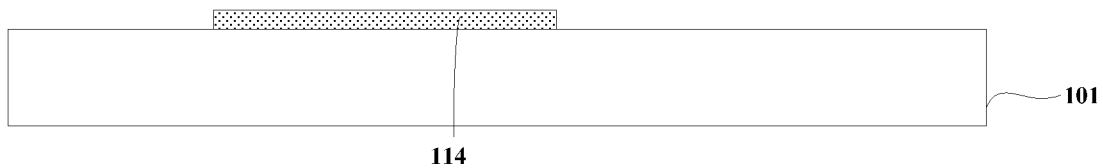
FIGS. 5A-5K are schematic cross-sectional views showing structures obtained in different stages of forming an array substrate according to some embodiments of the present disclosure.
Figure 6A:
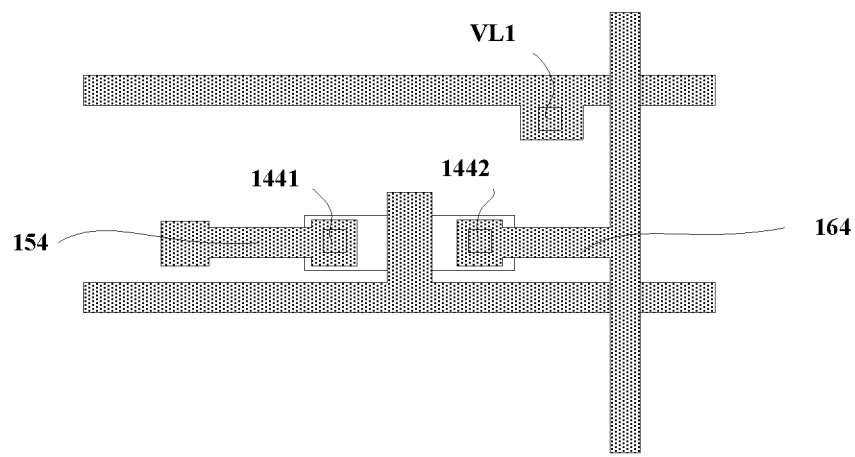
FIGS. 6A-6B are schematic views showing a layout design of an array substrate according to some embodiments of the present disclosure.
Figure 6A:
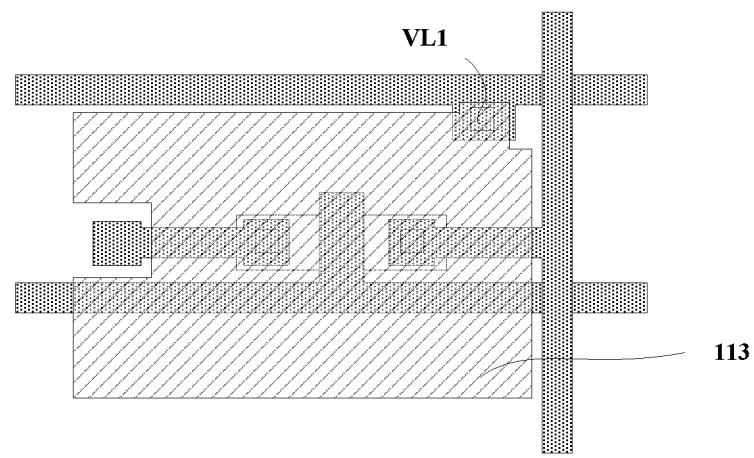
Figure 6B:
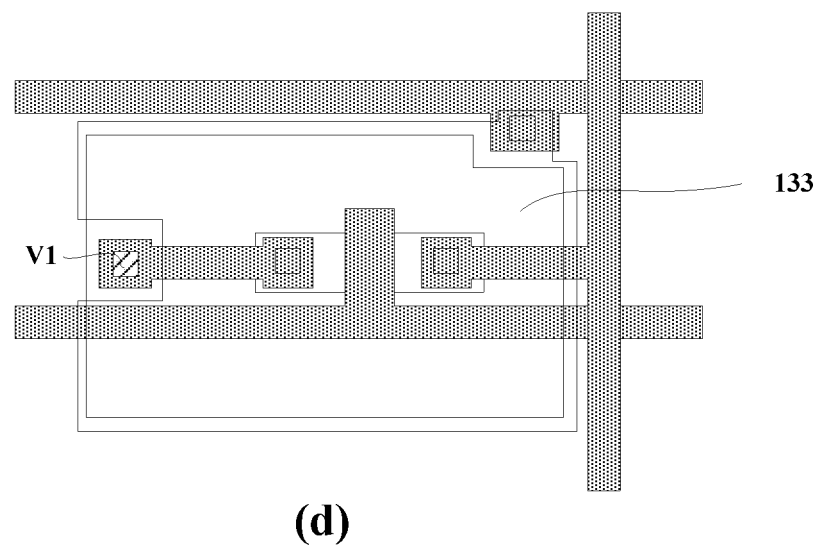
Figure 6B:
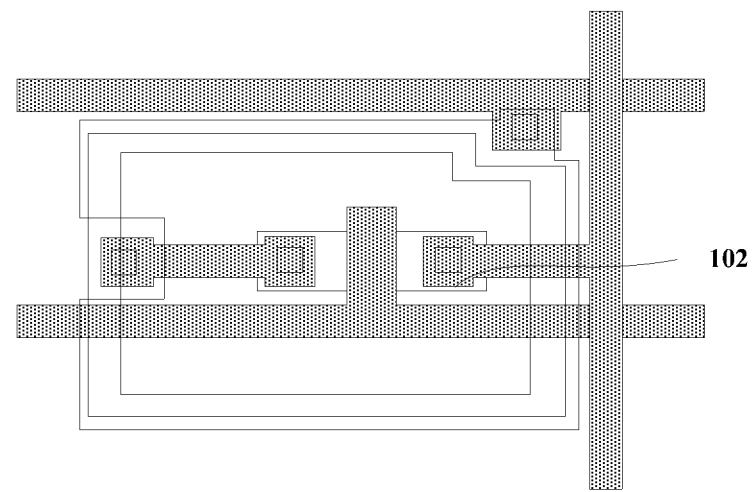
Figure 6B:
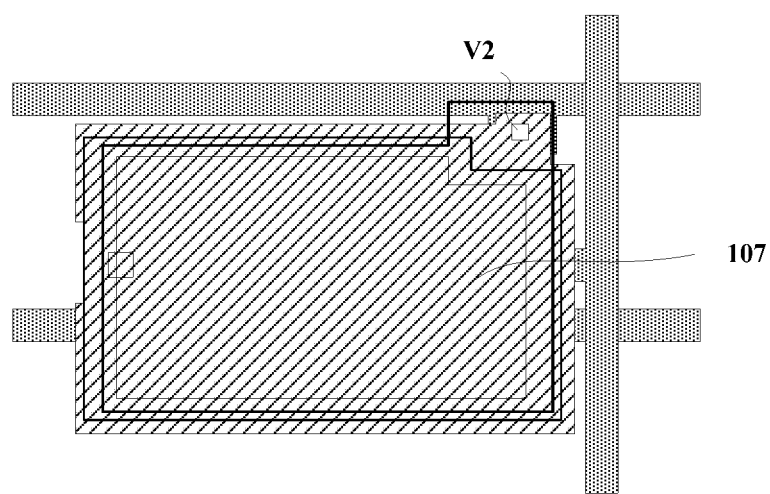

As shown in FIG. 5A, a base substrate 101 is provided, and an active layer 114 is formed on one side of the base substrate 101.

For example, the material of the active layer 114 may comprise oxide semiconductor, polycrystalline, amorphous silicon, organic semiconductor, or the like. The oxide semiconductor may comprise, for example, amorphous indium gallium zinc oxide (a-IGZO), zinc oxynitride (ZnON), indium zinc tin oxide (IZTO), or the like. The organic semiconductor may comprise, for example, sexithiophene, polythiophene, or the like.

Figure 5B:
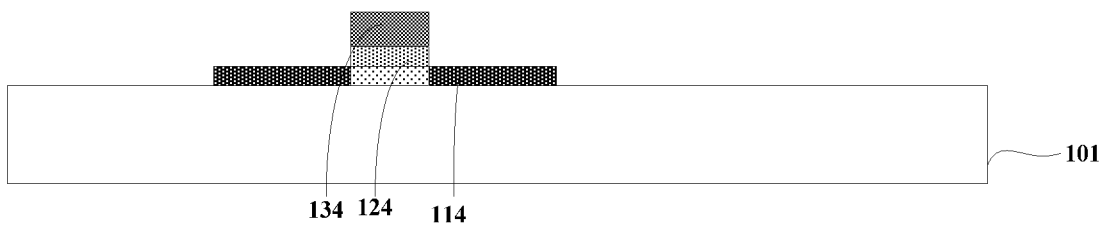

As shown in FIG. 5B, a gate dielectric layer 124 is formed on one side of the active layer 114 away from the base substrate 101, and a gate 134 is formed on one side of the gate dielectric layer 124 away from the active layer 14. The material of the gate dielectric layer 124 may comprise, for example, silicon oxide or the like. The material of the gate 134 may comprise, for example, a metal material or the like.

In some embodiments, a gate dielectric material layer and a gate material layer may be sequentially formed on one side of the active layer 114 away from the base substrate 101, and then patterned using a same mask to form the gate dielectric layer 124 and the gate 134. In this case, the orthographic projection of the gate dielectric layer 124 on the base substrate 101 fully coincides with the orthographic projection of the gate 134 on the base substrate 101. It should be understood that the embodiments of the present disclosure are not limited thereto.

In addition, after the gate dielectric layer 124 and the gate 134 are formed, the areas of the active layer 114 not covered by the gate dielectric layer 124 (i.e., areas other than a channel area) may also be treated using the same mask as a mask to reduce a contact resistance between the subsequently formed first and second electrodes and the active layer. The treatment here may comprise doping, or plasma bombardment, or the like. For example, in the case where the material of the active layer 114 is polysilicon or amorphous silicon, areas of the active layer 114 other than the channel area may be doped, for example, heavily doped to form a doped area. For another example, in the case where the material of the active layer 114 is an oxide semiconductor, plasma bombardment may be performed on areas of the active layer 114 other than the channel area to increase oxygen vacancies in the active layer 114. As some implementations, source gases of the plasma in plasma bombardment may comprise, but is not limited to, inert gases such as helium or argon.

Referring to (a) of FIG. 6A, the gate 134 and the signal line VL may be formed by a same patterning process. That is, the gate 134 and the signal line VL may be simultaneously formed by performing a patterning process on the same material layer.

Figure 5C:
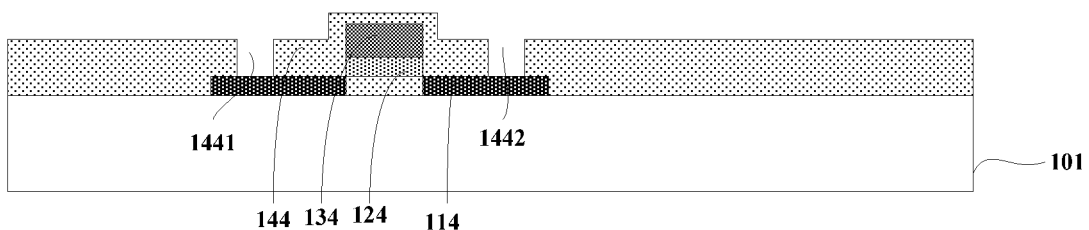

As shown in FIG. 5C, an interlayer dielectric layer 144 covering the gate 134 is formed on one side of the gate dielectric layer 124 away from the base substrate 101. Here, the interlayer dielectric layer 144 defines a second opening 1441 and a third opening 1442 which extend to the active layer 114. The material of the interlayer dielectric layer 144 may comprise, for example, silicon oxide, silicon nitride, silicon oxynitride, or the like.

In some embodiments, during the process of forming the sensing transistor 104 on one side of the base substrate 101, a driving transistor (not shown) that drives the light emitting device to emit light may also be formed. The orthographic projection of the driving transistor on the base substrate 101 is spaced apart from the orthographic projection of the sensing transistor 104 on the base substrate 101. After the light emitting device is subsequently formed, the driving transistor is located between the base substrate 101 and the light emitting device.

Figure 5D:
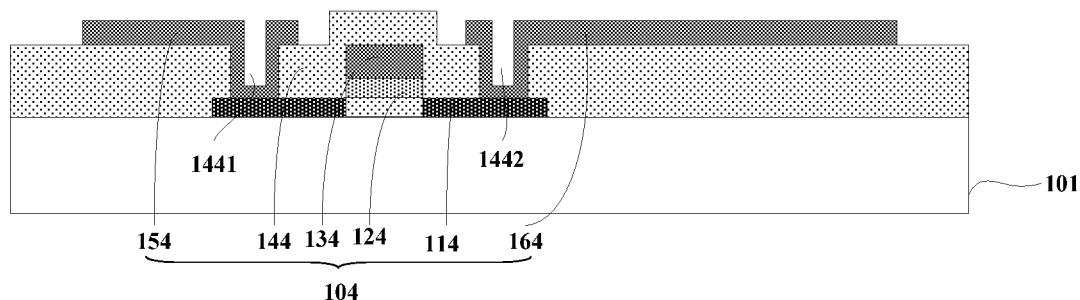

As shown in FIG. 5D and (b) of FIG. 6A, a first electrode 154 at least partially located in the second opening 1441 and in contact with the active layer 114 is formed, and a second electrode 164 at least partially located in the third opening 1442 and in contact with the active layer 114 is formed.

Figure 5E:
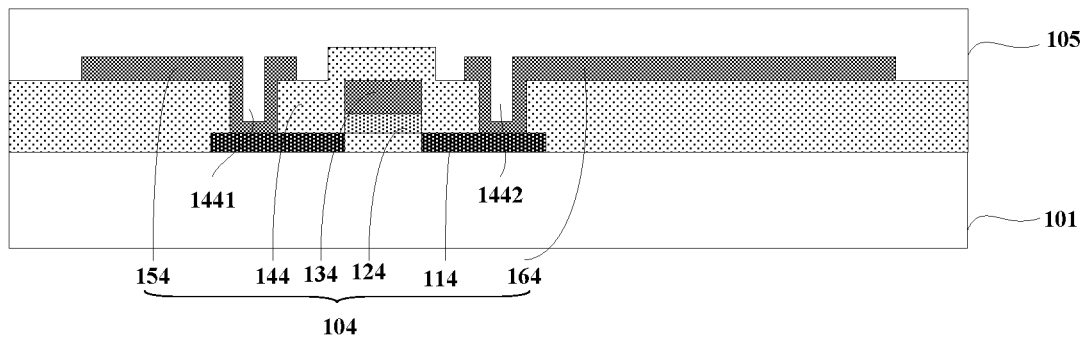

As shown in FIG. 5E, after the sensing transistor 104 is formed, a first dielectric layer 105 covering the sensing transistor 104 is formed. In addition, referring to (b) of FIG. 6A, an opening VL1 extending to the signal line VL is formed.

Figure 5F:
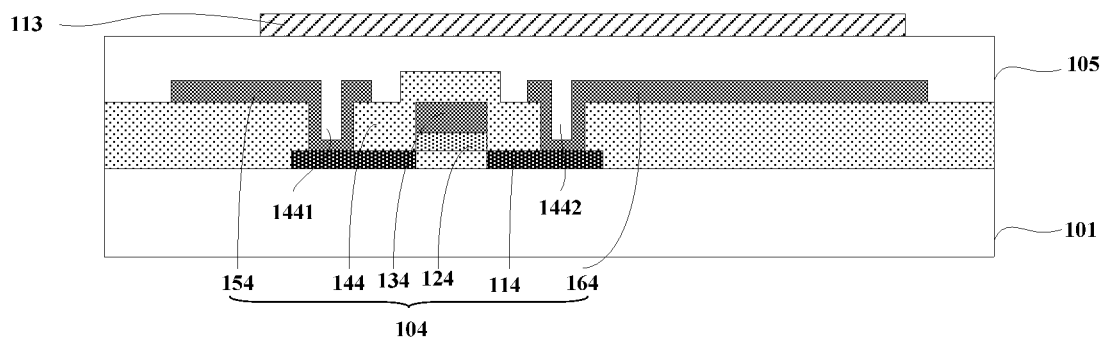
Figure 5G:
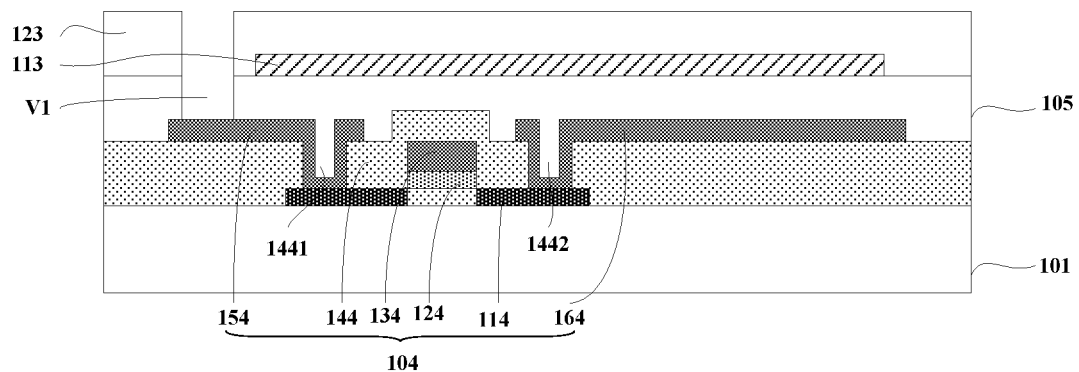

Next, the process of forming the capacitor 103 will be introduced in conjunction with FIGS. 5F-5G.

As shown in FIG. 5F and (c) of FIG. 6A, the first metal layer 113 connected to the signal line VL is formed on one side of the first dielectric layer 105 away from the base substrate 101.

As shown in FIG. 5G, a second dielectric layer 123 is formed on one side of the first dielectric layer 105 away from the base substrate 101 and one side of the first metal layer 113 away from the base substrate 101. Here, the orthographic projection of the first metal layer 113 on the base substrate 101 is within the orthographic projection of the second dielectric layer 123 on the base substrate 101.

Then, a first via V1 penetrating the second dielectric layer 123 and the first dielectric layer 105 is formed. It should be understood that the embodiments of the present disclosure are not limited thereto. For example, in some embodiments, after the first dielectric layer 105 is formed, a first hole penetrating the first dielectric layer 105 may be formed first; after the second dielectric layer 123 is formed, a second hole penetrating the second dielectric layer 123 and communicating with the first hole may be formed so as to form the first via V1.

Figure 5H:
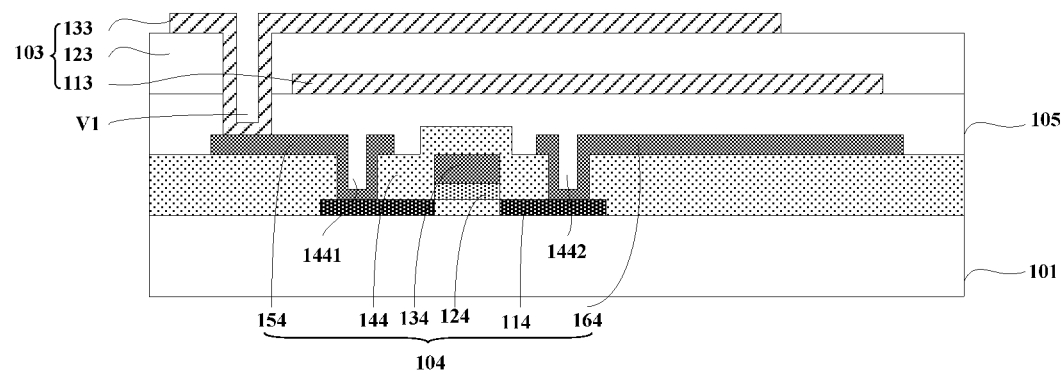

As shown in FIG. 5H and (d) of FIG. 6B, a second metal layer 133 is formed on one side of the second dielectric layer 123 away from the base substrate 101. Here, the second metal layer 133 is connected to the first electrode 154 of the sensing transistor 104 through the first via V1 penetrating the second dielectric layer 123 and the first dielectric layer 105.

Figure 5I:
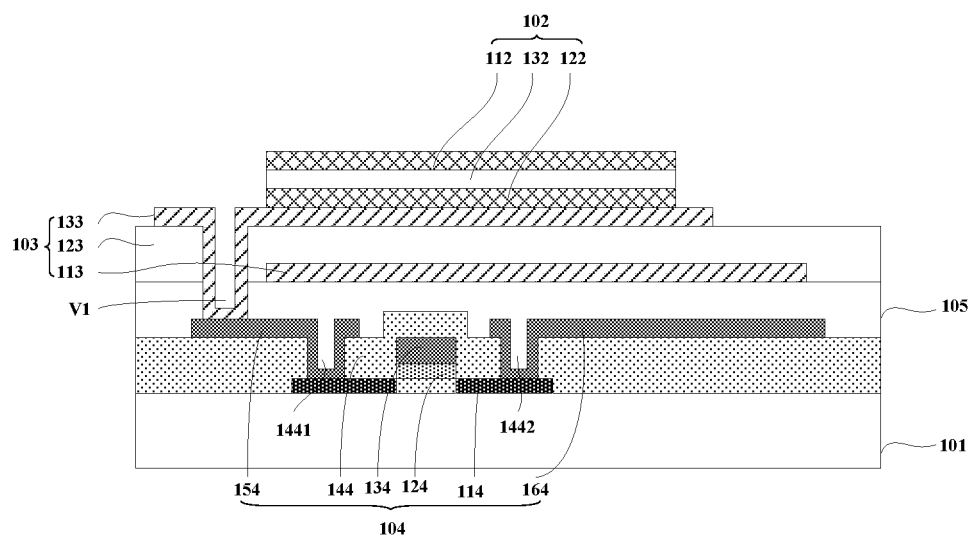

After the capacitor 103 is formed, as shown in FIG. 5I and (e) of FIG. 6B, a photosensitive element 102 is formed on one side of the second metal layer 133 away from the base substrate 101. For example, an N-type semiconductor layer 122 may be formed on one side of the second metal layer 133 away from the base substrate 101, and then a P-type semiconductor layer 112 may be formed on one side of the N-type semiconductor layer 122 away from the base substrate 101. In some embodiments, after the N-type semiconductor layer 122 is formed on one side of the second metal layer 133 away from the base substrate 101, an intrinsic semiconductor layer 132 is formed on one side of the N-type semiconductor layer 122 away from the base substrate 101, and then, the P-type semiconductor layer 112 is formed on one side of the intrinsic semiconductor layer 132 away from the base substrate 101.

Figure 5J:
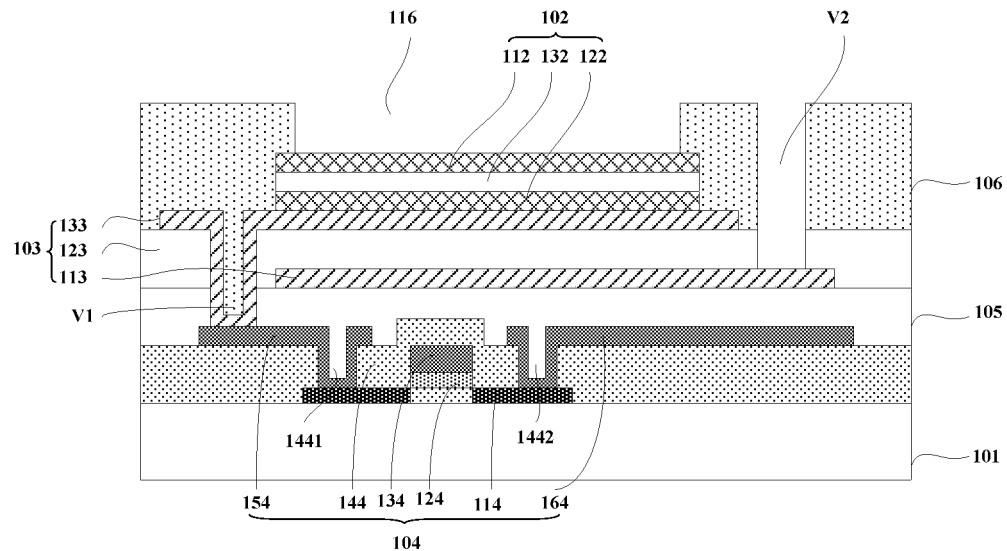

As shown in FIG. 5J, a planarization layer 106 is formed on one side of the second dielectric layer 123 away from the base substrate 101 and one side of the P-type semiconductor layer 112 away from the base substrate 101. The planarization layer 106 defines a first opening 116 extending to the P-type semiconductor layer 112. In addition, a second via V2 penetrating the planarization layer 106 and the second dielectric layer 123 may also be formed.

Figure 5K:
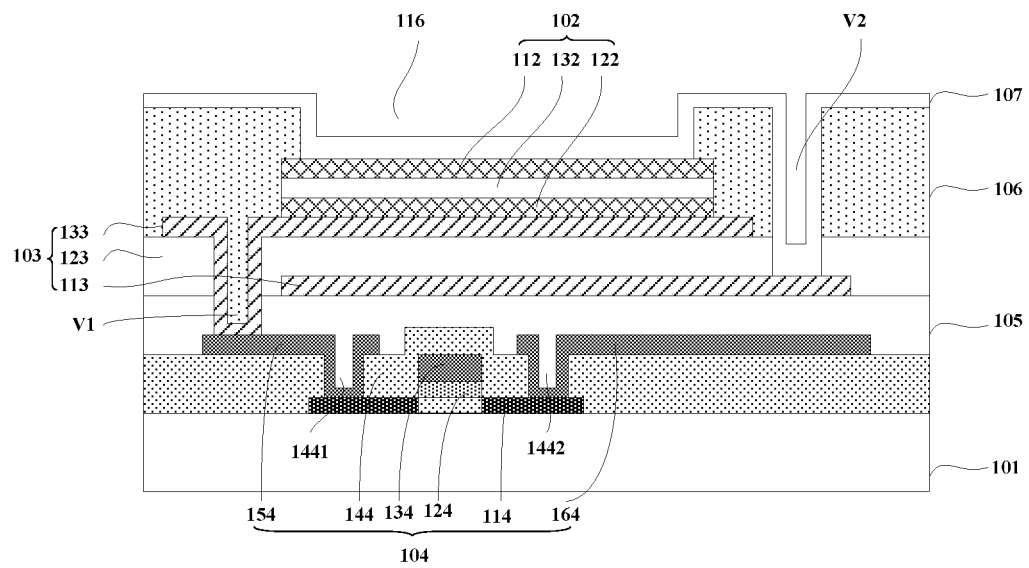

As shown in FIG. 5K and (f) of FIG. 6B, an electrode layer 107 partially located in the first opening 116 and in contact with the P-type semiconductor layer 122 is formed. In addition, the electrode layer 107 is connected to the first metal layer 113 through the second via V2 penetrating the planarization layer 106 and the second dielectric layer 123.

After that, the light emitting device 200 may be formed on the structure shown in FIG. 5K.

For example, first, a planarization layer is formed on the structure shown in FIG. 5K; then, an anode is formed on the planarization layer; next, a pixel defining layer defining an opening that exposes at least a part of the anode is formed on the anode; next, a functional layer is formed in the opening; after that, a cathode is formed on the functional layer. Accordingly, the light emitting device 200 may be formed.

The embodiments of the present disclosure also provide a display device. The display device may comprise the array substrate according to any one of the above embodiments. In some embodiments, the display device may be any product or member having a display function, such as a display panel, a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. An array substrate, comprising:
a base substrate;
a photosensitive element located between the base substrate and a light emitting device and configured to sense light emitted from the light emitting device and generate a sensing signal according to the light;
a capacitor configured to store the sensing signal;
a sensing transistor located between the base substrate and the photosensitive element and configured to transmit the sensing signal to a sensing line, wherein an orthographic projection of the sensing transistor on the base substrate at least partially overlaps with an orthographic projection of the photosensitive element on the base substrate; and
a first dielectric layer covering the sensing transistor,
wherein the capacitor is located between the photosensitive element and the sensing transistor and comprises a second metal layer, the orthographic projection of the photosensitive element on the base substrate being fully located within an orthographic projection of the second metal layer on the base substrate, and the second metal layer being not comprised in the photosensitive element;
wherein the capacitor comprises:
a first metal layer connected to a signal line and located on one side of the first dielectric layer away from the base substrate,
a second dielectric layer located on the one side of the first dielectric layer away from the base substrate and one side of the first metal layer away from the base substrate, wherein an orthographic projection of the first metal layer on the base substrate is within an orthographic projection of the second dielectric layer on the base substrate, and
the second metal layer located on one side of the second dielectric layer away from the base substrate and connected to a first electrode of the sensing transistor through a first via penetrating the second dielectric layer and the first dielectric layer;
wherein the photosensitive element is located on one side of the second metal layer away from the base substrate; and
wherein the sensing transistor comprises:
an active layer,
a gate dielectric layer located on one side of the active layer away from the base substrate,
a gate located on one side of the gas dielectric layer away from the active layer;
an interlayer dielectric layer located on one side of the gate dielectric layer away from the base substrate and covering the gate, wherein the interlayer dielectric layer defines a second opening and a third opening which extend to the active layer, and
a second electrode at least partially located in the third opening and in contact with the active layer, wherein the first electrode is at least partially located in the second opening and in contact with the active layer, and wherein a material of the gate is the same as a material of the signal line.

2. The array substrate according to 1, wherein the second metal layer is partially located in the first via and in contact with the first electrode of the sensing transistor.

3. The array substrate according to claim 1, wherein the photosensitive element comprises a P-type semiconductor layer, and an N-type semiconductor layer located between the P-type semiconductor layer and the second metal layer.

4. The array substrate according to claim 3, further comprising:
a planarization layer located on the one side of the second dielectric layer away from the base substrate and one side of the P-type semiconductor layer away from the base substrate, wherein the planarization layer defines a first opening extending to the P-type semiconductor layer; and
an electrode layer partially located in the first opening and in contact with the P-type semiconductor layer, wherein the electrode layer is connected to the first metal layer through a second via penetrating the planarization layer and the second dielectric layer.

5. The array substrate according to 4, wherein the electrode layer is partially located in the second via and in contact with the first metal layer.

6. The array substrate according to claim 3, wherein the photosensitive element further comprises an intrinsic semiconductor layer located between the P-type semiconductor layer and the N-type semiconductor layer.

7. The array substrate according to claim 6, wherein a material of at least one of the P-type semiconductor layer, the N-type semiconductor layer, or the intrinsic semiconductor layer comprises hydrogen.

8. The array substrate according to claim 1, further comprising:
a driving transistor located between the base substrate and the light emitting device, wherein an orthographic projection of the driving transistor on the base substrate is spaced apart from the orthographic projection of the sensing transistor on the base substrate.

9. The array substrate according to claim 1, wherein the orthographic projection of the sensing transistor on the base substrate is within the orthographic projection of the photosensitive element on the base substrate.

10. A display device, comprising the array substrate according to claim 1.

11. A method for manufacturing an array substrate, comprising:
providing a base substrate;
forming a sensing transistor and a capacitor on one side of the base substrate;
forming a photosensitive element on one side of the sensing transistor away from the base substrate, wherein an orthographic projection of the photosensitive element on the base substrate at least partially overlaps with an orthographic projection of the sensing transistor on the base substrate, wherein the photosensitive element is configured to sense light emitted from a light emitting device and generate a sensing signal according to the light, the capacitor is configured to store the sensing signal, and the sensing transistor is configured to transmit the sensing signal to a sensing line; and
forming a first dielectric layer covering the sensing transistor after forming the sensing transistor, wherein:
the forming of the capacitor comprises:
forming a first metal layer connected to a signal line on one side of the first dielectric layer away from the base substrate;
forming a second dielectric layer on the one side of the first dielectric layer away from the base substrate and one side of the first metal layer away from the base substrate, wherein an orthographic projection of the first metal layer on the base substrate is within an orthographic projection of the second dielectric layer on the base substrate;
forming the second metal layer on one side of the second dielectric layer away from the base substrate, wherein the second metal layer is connected to a first electrode of the sensing transistor through a first via penetrating the second dielectric layer and the first dielectric layer; and
the forming of the photosensitive element comprises forming the photosensitive element on one side of the second metal layer away from the base substrate,
wherein a gate of the sensing transistor and the signal line are formed by a same patterning process.

12. The method according to claim 11, wherein forming the photosensitive element comprises:
forming an N-type semiconductor layer on one side of the second metal layer away from the base substrate; and
forming a P-type semiconductor layer on one side of the N-type semiconductor layer away from the base substrate.

13. The method according to claim 12, further comprising:
forming a planarization layer on the one side of the second dielectric layer away from the base substrate and one side of the P-type semiconductor layer away from the base substrate, wherein the planarization layer defines a first opening extending to the P-type semiconductor layer; and
forming an electrode layer partially located in the first opening and in contact with the P-type semiconductor layer, wherein the electrode layer is connected to the first metal layer through a second via penetrating the planarization layer and the second dielectric layer.

14. The method according to claim 12, wherein forming the photosensitive element further comprises:
forming an intrinsic semiconductor layer on one side of the N-type semiconductor layer away from the base substrate,
wherein the P-type semiconductor layer is formed on one side of the intrinsic semiconductor layer away from the base substrate.

15. The method according to claim 11, wherein forming the sensing transistor comprises:
forming an active layer;
forming a gate dielectric layer on one side of the active layer away from the base substrate;
forming the gate on one side of the gate dielectric layer away from the active layer;
forming an interlayer dielectric layer covering the gate on one side of the gate dielectric layer away from the base substrate, wherein the interlayer dielectric layer defines a second opening and a third opening which extend to the active layer;
forming the first electrode at least partially located in the second opening and in contact with the active layer; and
forming a second electrode at least partially located in the third opening and in contact with the active layer.

16. The method according to claim 11, further comprising:
forming a driving transistor on the one side of the base substrate, wherein the driving transistor is located between the base substrate and the light emitting device, and an orthographic projection of the driving transistor on the base substrate is spaced apart from the orthographic projection of the sensing transistor on the base substrate.

* * * * *

UNITED STATES PATENT AND TRADEMARK OFFICE
CERTIFICATE OF CORRECTION

PATENT NO. : 11,637,152 B2
APPLICATION NO. : 16/759508
DATED : April 25, 2023
INVENTOR(S) : Guoying Wang et al.

It is certified that error appears in the above-identified patent and that said Letters Patent is hereby corrected as shown below:

In the Claims

Column 12, Line 54, Claim 1, delete "laver" and insert -- layer --

Column 12, Line 55, Claim 1, delete "gas" and insert -- gate --

Column 12, Line 60, Claim 1, delete "laver" and insert -- layer --

Column 13, Line 1, Claim 2, after "to" insert -- claim --

Column 13, Line 21, Claim 5, after "to" insert -- claim --

Signed and Sealed this
Thirteenth Day of June, 2023

Katherine Kelly Vidal
*Director of the United States Patent and Trademark Office*